United States Patent [19]

Katakura

[11] 4,084,129
[45] Apr. 11, 1978

[54] VOLTAGE CONTROLLED VARIABLE GAIN CIRCUIT

[75] Inventor: Masayuki Katakura, Yokohama, Japan

[73] Assignee: Tokyo Shibaura Electric Co., Ltd., Kawasaki, Japan

[21] Appl. No.: 768,366

[22] Filed: Feb. 14, 1977

[30] Foreign Application Priority Data

Feb. 20, 1976 Japan .............................. 51-18424[U]

[51] Int. Cl.² ............................................... H03G 3/30
[52] U.S. Cl. ..................................... 330/282; 330/85; 330/86; 330/110; 330/293
[58] Field of Search ..................... 330/28, 29, 85, 86, 330/110; 307/229, 230

[56] References Cited

U.S. PATENT DOCUMENTS 3,502,905  3/1970  Bicking .......................... 307/251 X
3,714,462  1/1973  Blackmer ........................ 328/145 X

*Primary Examiner*—James B. Mullins
*Attorney, Agent, or Firm*—Oblon, Fisher, Spivak, McClelland & Maier

[57] ABSTRACT

A voltage controlled variable gain circuit comprising: first, second, third and fourth same polarity transistors for dividing the output current of a first operational amplifier by dc gain control voltage and being connected with the output terminal of the first operational amplifier to which an input signal is applied; means for driving in inverse phase the respective pairs of a first and third transistors, and a second and fourth transistors; a first feedback circuit including a second operational amplifier with an inverting input terminal connected with the output terminal of the first transistor, a first resistor element and a first PN junction element connected in series between the input and output terminals of the second operational amplifier, and a second resistor element and a second PN junction element connected in series between the output of the second operational amplifier and the input terminal of the first operational amplifier, so as to negatively feedback the output current of the first transistor to the input terminal of the first operational amplifier: a second feedback circuit for negatively feeding back the output current of the second transistor to the input terminal of the first operational amplifier; and summing device for summing the output current of the third transistor inversed and the output current of the fourth transistor.

3 Claims, 4 Drawing Figures

VOLTAGE CONTROLLED VARIABLE GAIN CIRCUIT

The present invention relates to a voltage controlled variable gain circuit of which the gain varies depending on dc gain control voltage.

A noise reduction device for an audio apparatus commercially available with a trade name "dbx" manufactured by DBX Corporation in U.S.A., requires a voltage controlled variable gain circuit excellent in frequency characteristic, gain control range, noise characteristic, harmonic distortion factor and the like. The dbx system is discussed in detail in U.S. Pat. Nos. 3,789,143, 3,681,618, and 3,714,462 and thus detailed discussion of it will be omitted in this specification.

It is very difficult to manufacture a voltage controlled variable gain circuit having fully satisfied the requirement of such various characteristics. One of the voltage controlled variable gain circuits developed is found in U.S. Pat. No. 3,714,462. In the device of the patent, all the transistors used must have the same saturation currents, otherwise even harmonics occur. So far as individual transistors are used, it is almost impossible to control variation of the saturation currents of individual transistors below several %.

Another attempt was to employ an integrated circuit for the voltage controlled variable gain circuit; however, this attempt encountered a problem of increase of the input offset current of an operational amplifier by integrated circuit. The increase of the input offset current causes to limit the variable gain range. Accordingly, this must be avoided. The decrease of the input offset current requires increase of the chip area of the integrated circuit. When the input offset current is decreased by increasing the chip area, it was found that the circuit operates in undesirable non-linear mode.

Accordingly, an object of the present invention is to provide an integrated voltage controlled variable gain circuit in which the input offset current is decreased without any increase of the chip area of the integrated circuit. The present invention achieves the object by a construction that a PN junction element is connected in series to a resistance element connected with the output terminal of a current mirror comprising an operational amplifier and the sum of the resistances of both elements substantially changes depending on the gain of a circuit.

According to the present invention, there is provided a voltage controlled variable gain circuit comprising; a first operational amplifier to which an input signal is applied; four same polarity transistors connected with the output terminal of the first operational amplifier and for dividing the output current thereof by dc gain control voltage; a first and a second feedback circuit for negative-feeding back in phase the output currents of two of the four transistors to the input of the first operational amplifier; summing means for summing in phase the output currents of the remaining two transistors; a second operational amplifier of which the inverting input terminal and the output terminal are connected in the first feedback circuit; and first and second resistor elements respectively connected between the input and output terminals of the second operational amplifier and between the output terminal of the second operational amplifier and the input terminal of the first operational amplifier, characterized in that the voltage controlled variable gain circuit comprises: at least one first PN junction element connected in series with the first resistor element; and at least one second PN junction element connected in series with the second resistor element.

Other objects and features of the present invention will be apparent from the following description taken in connection with the accompanying drawings, in which.

Figure 1:
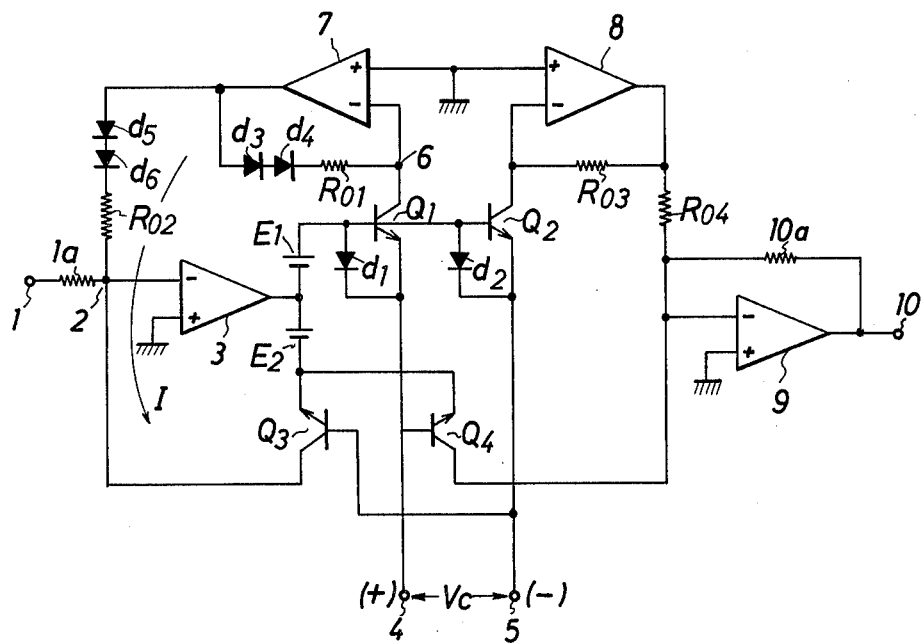
FIG. 1 shows a circuit diagram of an embodiment of a voltage controlled variable gain circuit according to the the present invention.

Referring now to FIG. 1, there is shown a voltage controlled variable gain circuit according to the present invention. In the figure, an input signal, e.g. an audio signal, is applied to an input terminal 1. The input signal applied to the input terminal 1 is coupled with an inverting input terminal of an operational amplifier 3 through an input resistor $1a$ and a circuit connection point or a node 2. The non-inverting input terminal of the operational amplifier 3 is grounded. The output of the operational amplifier 3 is connected with the negative side of a dc biasing source E1 and the positive side of a dc biasing source E2. The positive side of the dc biasing source E1 is connected with the bases of NPN transistors Q1 and Q2. Diodes $d1$ and $d2$ are connected between bases and emitters of the NPN transistors Q1 and Q2, respectively. The negative side of the dc biasing source E2 is connected with the emitters of Q3 and Q4 of NPN transistors. The emitters of the NPN transistors Q1 and Q2 are connected with terminals 4 and 5, respectively, across which dc gain control voltage Vc is applied. The terminals 4 and 5 are connected with the bases of the NPN transistors Q3 and Q4, respectively. With such a circuit connection, the transistors Q1 and Q3 are driven in inverse phase and the transistors Q2 and Q4 are similarly driven. Thus, the NPN transistors Q1 to Q4 are driven by the dc gain control voltage Vc and the output current of the operational amplifier 3 is divided to flow through the respective transistors Q1 to Q4.

The collector of the NPN transistor Q1 is coupled with the inverting input terminal of an operational amplifier 7 and one end of a resistor element R01. The operational amplifier 7 is grounded at the non-inverting input terminal and connected at the output terminal with the other end of the resistor element R01 through diodes $d3$ and $d4$ connected in series. A series circuit consisting of diodes $d3$, $d4$ and the resistor element R01 is connected between the inverting input terminal and the output terminal of the operational amplifier 7 to form a negative feedback circuit. The output terminal of the operational amplifier 7 is coupled with the inverting input terminal of the operational amplifier 3 through two series diodes $d5$ and $d6$, a resistor element R02, and the circuit connection point 2. That is, the dc biasing source E1, the NPN transistor Q1, the operational amplifier 7, the diodes $d5$ and $d6$, and the resistor element R02, constitute a negative feedback circuit between the output of the operational amplifier 3 and its inverting input terminal. The output current from the collector of the NPN transistor Q1 is negative-fed back to the inverting input terminal of the operational amplifier 3. It is to be noted here that the negative feedback circuit consisting of the NPN transistor Q1, the operational amplifier 7, the diodes d3 and d4 and the resistor element R01 operates equivalently as a PNP transistor.

The collector of the NPN transistor Q3 is coupled with the inverting input terminal of the operational amplifier 3 through the node 2, and thus the dc biasing source E2 and the transistor Q3 constitute a second negative feedback circuit of the operational amplifier 3 through which the output current of the transistor Q3 is negative-fed back to the inverting input terminal of the operational amplifier 3. In this manner, the output currents of the transistors Q1 and Q3 are fed back in phase to the inverting input terminal of the operational amplifier 3.

The collector of the transistor Q2 is connected with the inverting input terminal of an operational amplifier 8 of which the non-inverting input terminal is grounded and one end of a resistor element R03. The output terminal of the operational amplifier 8 is connected with the other end of the resistor element R03 and also connected with the inverting input terminal of an operational amplifier 9 of which the non-inverting input terminal is grounded, through a resistor element R04. A resistor element 10a is coupled between the inverting input terminal and the output terminal of the operational amplifier 9. Thus, the output current of the transistor Q2 is inversely coupled with the inverting input terminal of the operational amplifier 9.

The collector of the transistor Q4 is directly coupled with the inverting input terminal of the operational amplifier 9. As described above, the transistors Q2 and Q4 are driven with the reaction of inverse phase by the dc voltage Vc, and the output current of the transistor Q2 is inversed in the operational amplifier 8. For this, the output currents of the transistors Q2 and Q4 are coupled in phase with the inverting input terminal of the operational amplifier 9 where those are summed to be applied to the output terminal 10.

The operation to follow will be described with reference to the case that the voltage controlled variable gain circuit is used as a voltage controlled amplifier of the dbx noise reduction system. As stated previously, in order to obtain the voltage controlled variable gain circuit which is particularly excellent in the harmonic distortion factor, the respective transistors constituting the circuit must have the same saturation current and thus the circuit of FIG. 1 is integrated-circuited. Generally, in the integrated circuit using a silicon substrate, the NPN transistor is constructed by a vertical transistor and the PNP transistor by a lateral transistor. When the voltage controlled variable gain circuit is constructed in a push-pull connection fashion both NPN and PNP types of transistors are necessary. The current amplification factor of the vertical transistor for NPN type transistor is, for example, about 100, and that of the lateral transistor of PNP is about 1 to 10. It is impossible thus to obtain the voltage controlled variable gain circuit having a good characteristic, when those types of transistors are merely used. It is for this reason that, in the circuit of FIG. 1, a combination circuit of the NPN transistor Q1 and the current inverting type operational amplifier 7 is used equivalently as a PNP transistor. That is, with such a construction, only the NPN transistors are used without using the lateral type PNP transistor to construct the push-pull circuit by the integrated circuit. The other combination circuit of the NPN transistor Q2 and the current inverting type operational amplifier 8 similarly acts equivalently as a PNP transistor. To make the transistors Q1 to Q4 operate in push-pull mode, the dc gain control voltage Vc is applied to the emitters of the transistors Q1 and Q2 operating as PNP transistor, while the dc gain control voltage Vc is applied to the bases of the transistors Q3 and Q4. In this way, the respective pairs of the transistors Q1 and Q2, and Q3 and Q4 are driven in inverse phase to each other. It is desirable that the output impedance of the operational amplifier 3 is high. In this case, however, the dynamic impedances of the transistors Q1 and Q2 are considerably high compared with those of the transistors Q3 and Q4. It is for this reason that the diodes d1 and d2 are employed. That is, those diodes are used for balancing the dynamic impedances of those transistors Q1 to Q4. Since the gain control voltage Vc energizes the emitters of the transistors Q1 and Q2, the power source of the voltage Vc must be the one having sufficiently small impedance. As such a low-impedance power source, is a negative feedback amplifier, for example.

The circuit of FIG. 1 is so constructed as to be operable without adverse affect by the input offset current. The adverse affect by the offset voltage comes into the open when the gain of the circuit is very large. The dbx noise reduction system is such that, in recording mode, the signal dynamic range is compressed half, and, in the reproducing mode, it is restored to the original state by expansion. Accordingly, the voltage controlled variable gain circuit of the recording device (encoder) is very large in the gain when no input signal exists. That is, the gain of the variable gain circuit of the encoder is very high in such a case. Such gain reaches 50 dB, for example, and thus when the input offset current is 1 μA, the output current reaches about 300 μA. Let the resistor 10a be 50 kilo-ohm as a typical value, the dc potential at the output terminal 10 shifts about 15 V from the ground potential. This varies depending upon the control voltage so that the control signal component is incorporated into the output signal. One of the factors providing the input offset current is the input bias current of the operational amplifier 3. It is not very difficult to control the input bias current below several tens nano-amperes. The cause for input offset current increase resides mainly in the input offset voltage of the operational amplifiers 3 and 7. The current $i$ flowing into the connection point 2 through the resistor R02 is given $$i = (\Delta V2 - \Delta V1)/R02$$

where $\Delta V1$ and $\Delta V2$ are the offset voltages at the connection points 2 and 6. It is difficult to restrain below 2 mV to 3 mV the maximum of the absolute value ($|\Delta V2 - \Delta V1|$) of the difference between two offset voltages. With the resistance of the resistor R02 1 kilo-ohm, the input offset current reaches 3 nA of the maximum. With 10 kilo-ohm of the resistor R02, it 300 μA of the maximum. When the current flowing through the resistor R02 is smaller than the maximum current flowing into the connection point 2 through the resistor 1a from the input terminal 1, undesirable non-linear operation takes place. For this, the resistor R02 must have the resistance smaller than a predetermined one.

This leads to such a construction of the FIG. 1 circuit that, in the region of not larger gain, the resistance of the resistor R02 is set substantially small so as to permit a larger current to flow while, in the high gain region (40 dB or larger) where the input offset current becomes problematic, that of the resistor R02 substantially high, in order that the variation of the potential at the output terminal 10 due to the control voltage Vc is minimized. In this case, in the region where the gain is very high, the input current is very small and hence a large resistance of the resistor R02 affects little other circuit.

Figure 2:
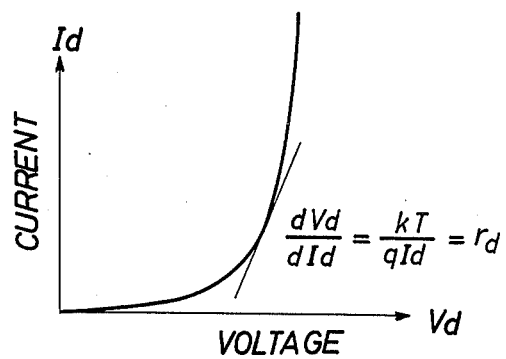
FIG. 2 shows a graph of current vs. voltage characteristic of a PN junction.

The above-mentioned requirement is fulfilled with the PN junction elements, i.e. the diodes $d3$, $d4$, $d5$ and $d6$, connected in series with the resistors R01 and R02 coupled with the output terminal of the current mirror constructed by the operational amplifier 7. The diodes $d3$ to $d6$ used are the ones exhibiting the ordinary voltage vs. current ($Vd - Id$) characteristic as shown in FIG. 2. In this type voltage controlled variable gain circuit, a slight idling current I is made flow through the respective transistors Q1 to Q4 from the biasing sources E1 and E2, in order to restrain the cross-over distortion occurring in the vicinity of the zero-cross point of current. The value of the idling current is abot 1 $\mu$A when the gain is 0 dB. Assume now that 3 $\mu$A is taken as the typical value, the differential resistances ($rd = dVd/dId$) of the respective diodes $d3$ to $d6$ are about 8.7 kilo-ohm. Although the input offset current under this condition is not improved with the use of the diodes $d3$ to $d6$, the idling current I of the transistors Q1 and Q3 is reduced 0.3 $\mu$A with impression of a high control voltage Vc when the offset current is problematic, i.e. in a high gain condition, for example, of 40 dB. At this time, the differential resistance $rd$ of each diode $d3$ to $d6$ is about 87 kilo-ohm, with the result that the input offset current is considerably reduced compared with the case of resistor elements R01 and R02 only. The differential resistances of the diodes $d3$ to $d6$ are very small when the circuit gain is small or when large signal current flows, so that the dynamic range of the circuit is little restricted. since the voltage normally drops about 0.7 volt a single diode, it is desirable to reduce the resistances of the resistors R01 and R02 by the value for compensating for such voltage drop of the diode. In this embodiment, a couple of diodes are connected in series with each resistor R01 and R02; however, it is practical to use one to three of diodes serially connected.

Figure 3:
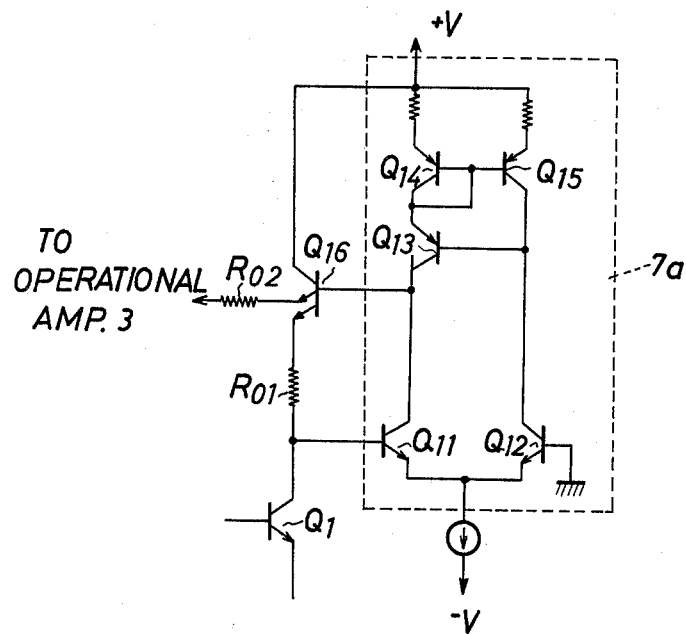
FIG. 3 shows a circuit diagram of a part of another embodiment of the voltage controlled variable gain circuit of the present invention.

FIG. 3 shows another embodiment in which a multi-emitter transistor is used in place of diodes $d3$ to $d6$ and a differential amplifier as the operational amplifier 7. An operational amplifier 7a enclosed dot-line block comprises a differential amplifier including transistors Q11 and Q12 and their load transistors Q13, Q14 and Q15. The inverting input terminal of the operational amplifier 7a is the base of the transistor Q11 to which the collector of the transistor Q1 and one end of the resistor element R01 are coupled as in the FIG. 1 circuit. The output terminal of the operational amplifier 7a is a connection point of the collector of the transistor Q11 and that of load transistor Q13, to which the base of the multi-emitter transistor Q16 of NPN type is connected. The collector of the multi-emitter transistor Q16 is connected with the +V power source. The first emitter of the transistor Q16 is connected with the inverting input terminal of the operational amplifier 3 through the resistor R02, and the second emitter thereof is connected with the other end of the resistor R01. Since the multi-emitter transistor Q16 is of NPN type, the PN junction exists between the base and emitter electrodes. It is apparent that the PN junction between the base and the first emitter corresponds to the diodes $d5$ and $d6$ of the FIG. 1 embodiment, and the PN junction between the base and the second emitter to the diodes $d3$ and $d4$. In the FIG. 3 embodiment, the multi-emitter transistor Q16 also acts as an emitter follower.

Figure 4:
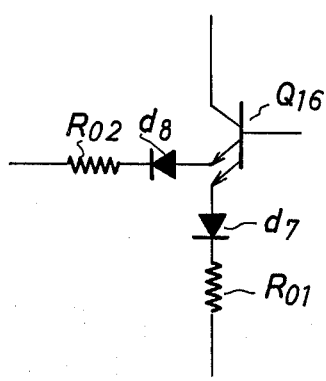
FIG. 4 shows a circuit diagram of a modification of the embodiment of FIG. 3.

Reference is now made to FIG. 4 illustrating another example in which diodes $d7$ and $d8$ are additionally connected between the first and second emitters of the multi-emitter transistor Q16 and the resistors R01 and R02. In other words, in this example, two PN junction elements are connected in series between the respective resistors R01 and R02 and the output terminal of the operational amplifier 7a. With such a circuit construction, the input offset current is further reduced compared with the FIG. 3 embodiment.

As described above, the present invention may considerably reduce the input offset current which is problematic in the integrated voltage controlled variable gain circuit. Restriction of it below 100 nA is easy. Further, there is no need of excessively large resistance of the operational amplifier. Accordingly, the maximum current of the current mirror is made sufficiently large, it is possible to prevent the current mirror from operating in non-linear fashion. Moreover, since the input offset current is made small without using a large resistor, the operating current of the circuit may be small thereby to improve the harmonic distortion factor, with a large tolerance of design.

Various other modifications of the disclosed embodiments will become apparent to person skilled in the art without departing from the spirit and scope of the invention as defined by the appended claims.

What is claimed is:

1. A voltage controlled variable gain circuit comprising a first operational amplifier to which an input signal is applied, four same polarity transistors connected with the output terminal of the first operational amplifier and for dividing the output current thereof by dc gain control voltage, a first and a second feedback circuit for negative-feeding back in phase the output currents of two of said four transistors to the input of said first operational amplifier, summing means for summing in phase the output currents of the remaining two transistors, a second operational amplifier of which the inverting input terminal and the output terminal are connected in said first feedback circuit, and first and second resistor elements being connected between the input and the output terminals of said second operational amplifier and between the output terminal of said second operational amplifier and the input terminal of the first operational amplifier, characterized in that said voltage controlled variable gain circuit comprises at least one first PN junction element connected in series with said first resistor element; and at least one second PN junction element connected in series with said second resistor element.

2. A voltage controlled variable gain circuit according to claim 1, in which said first and second PN junction elements are included in a multi-emitter transistor having a base connected to the output terminal of said second operational amplifier, a first emitter connected with one end of said first resistor element, a second emitter connected to one end of said second resistor element, and a collector connected with a power source.

3. A voltage controlled variable gain circuit according to claim 2, further comprising first and second diodes connected in series between said first and second emitters and said first and second resistor elements, respectively.

* * * * *